(12) United States Patent
Zhang et al.

(10) Patent No.: US 9,119,313 B2
(45) Date of Patent: Aug. 25, 2015

(54) PACKAGE SUBSTRATE WITH HIGH DENSITY INTERCONNECT DESIGN TO CAPTURE CONDUCTIVE FEATURES ON EMBEDDED DIE

(71) Applicant: INTEL CORPORATION, Santa Clara, CA (US)

(72) Inventors: Chong Zhang, Chandler, AZ (US); Stefanie M. Lotz, Phoenix, AZ (US); Islam A. Salama, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 154 days.

(21) Appl. No.: 13/870,874

(22) Filed: Apr. 25, 2013

(65) Prior Publication Data
US 2014/0321091 A1    Oct. 30, 2014

(51) Int. Cl.
*H05K 1/18*     (2006.01)
*H05K 1/11*     (2006.01)
*H05K 3/40*     (2006.01)

(52) U.S. Cl.
CPC .............. *H05K 1/115* (2013.01); *H05K 3/4084* (2013.01)

(58) Field of Classification Search
CPC .......... H05K 1/115; H05K 1/111; H05K 1/11
USPC .......... 361/760, 761, 764, 783; 174/260–263; 257/666, E21.506
See application file for complete search history.

(56) References Cited

U.S. PATENT DOCUMENTS

| | | | |
|---|---|---|---|
| 5,656,548 A * | 8/1997 | Zavracky et al. | 438/23 |
| 6,392,296 B1 * | 5/2002 | Ahn et al. | 257/698 |
| 8,064,224 B2 | 11/2011 | Mahajan et al. | |
| 2004/0113261 A1 * | 6/2004 | Sunohara et al. | 257/700 |
| 2009/0244874 A1 * | 10/2009 | Mahajan et al. | 361/809 |
| 2011/0147929 A1 * | 6/2011 | Roy et al. | 257/738 |
| 2014/0061927 A1 * | 3/2014 | Wu et al. | 257/762 |

* cited by examiner

*Primary Examiner* — Yuriy Semenenko
(74) *Attorney, Agent, or Firm* — Schwabe Williamson & Wyatt PC (57) ABSTRACT

Embodiments of the present disclosure are directed towards techniques and configurations for interconnect structures embedded in a package assembly including a bridge. In one embodiment, a package assembly may include a package substrate, a bridge embedded in the package substrate and including a bridge substrate, and an interconnect structure including a via extending through the package substrate into a surface of the bridge substrate and configured to interface with a conductive feature disposed on or beneath the surface of the bridge substrate. The interconnect structure may be configured to route electrical signals between the conductive feature and a die mounted on the package substrate. Other embodiments may be described and/or claimed.

25 Claims, 6 Drawing Sheets

PACKAGE SUBSTRATE WITH HIGH DENSITY INTERCONNECT DESIGN TO CAPTURE CONDUCTIVE FEATURES ON EMBEDDED DIE

FIELD

Embodiments of the present disclosure generally relate to the field of integrated circuits, and more particularly, to techniques and configurations for a bridge interconnect assembly that may be embedded in a package assembly.

BACKGROUND

In order to enhance performance, central processing unit (CPU) products are increasingly integrating multiple die within the CPU package in a side-by-side or other multi-chip-package (MCP) format. This development, along with other factors such as the long-standing trend toward increasing the density of transistors, requires high density die to die connections (measured by input/output (I/O) per millimeter (mm) of die edge per layer) for overall CPU performance improvement. Die to die connections are usually built through organic substrates with relative coarse circuit routing, which makes it difficult to increase the density of die to die connection to match the miniaturization trend within the die.

To overcome bandwidth limitations between logic-logic and/or logic-memory communications in MCPs, embedded silicon bridges (SiB) have been proposed as a means to achieve high density die-to-die interconnection. One approach for connecting through the package to the embedded bridge die may involve using ultra-small interconnection paths (via) having smallest possible interconnection pitches (spacing between adjacent via). However, it may be extremely difficult to scale a via pitch in organic package substrate to a desired size with current technology.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations for a bridge interconnect assembly that may be embedded in a package assembly and configured to improve bandwidth capability by providing high-density die-to-die interconnection. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first layer formed, deposited, or otherwise disposed on a second layer," may mean that the first layer is formed, deposited, or disposed over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
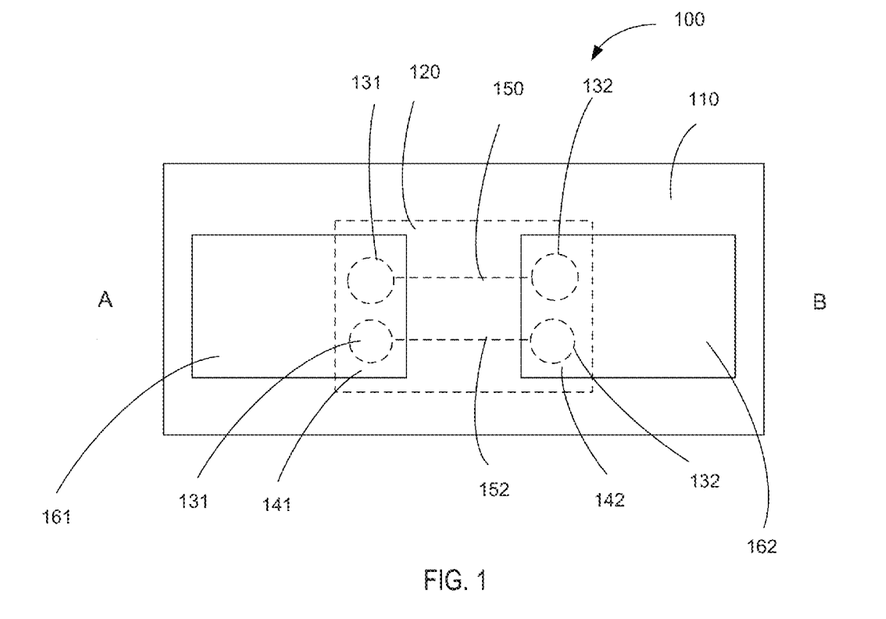
FIG. 1 schematically illustrates a top view of an example integrated circuit (IC) package assembly including an embedded bridge interconnect assembly, in accordance with some embodiments.

FIG. 1 is a plan view of an example integrated circuit (IC) package assembly 100 including an embedded bridge interconnect assembly (hereinafter "bridge") 120, in accordance with some embodiments. As illustrated in FIG. 1, the package assembly 100 comprises a package substrate 110 and bridge 120 may be embedded in package substrate 110. The package substrate 110 may be an organic substrate including, for example, build-up layers configured to route electrical signals through the package assembly 100.

The package assembly 100 may further comprise one or more interconnect structures 131 at a location 141 in the bridge 120, one or more interconnect structures 132 at a location 142 in the bridge 120, and electrically conductive line(s) 150, 152 in bridge 120 connecting interconnect structure 131 and interconnect structure 132 to each other. In the illustrated embodiment, interconnect structure 131 may be one of a plurality of interconnect structures located at location 141 and interconnect structure 132 may be one of a plurality of interconnect structures located at location 142. More or fewer electrically conductive line(s) 150, 152 than depicted may be used in other embodiments. As an example, these pluralities of interconnect structures may be designed to increase or maximize the number of interconnections they make possible. In FIG. 1 the outlines of the bridge 120, interconnect structures 131, 132, and electrically conductive lines 150, 152 are shown in dashed lines indicating that they are located beneath a top surface of the package substrate 110. The techniques for providing the interconnect structures 131 and 132 will be depicted in subsequent figures and further discussed below.

The package assembly 100 may further comprise a die 161 and a die 162 on or over the package substrate 110. FIG. 1 depicts die 161 and die 162 as if they were transparent (except for their outlines) so that the underlying detail may be seen. In general terms, location 141 is the area of bridge 120 that is under die 161 and location 142 is the area of the bridge 120 that is under die 162.

Figure 2:
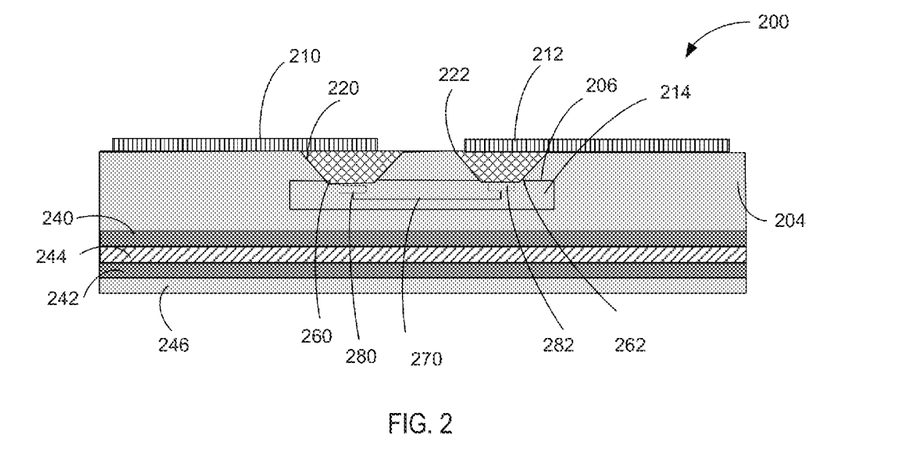
FIG. 2 schematically illustrates a cross-section side view of the example integrated circuit (IC) package assembly of FIG. 1, in accordance with some embodiments.

FIG. 2 schematically illustrates a cross-section side view of an example IC package assembly 200, along the lines A and B, in reference to package assembly 100 of FIG. 1, in accordance with some embodiments.

The IC package assembly 200 may include a package substrate 204 having a plurality (e.g., two or more) of dies 210, 212 mounted on the package substrate 204. In some embodiments, the package substrate 204 may be an epoxy-based laminate substrate having a core and/or build-up layers such as, for example, an Ajinomoto Build-up Film (ABF) substrate. The package substrate 204 may include other suitable types of substrates in other embodiments. The dies 210, 212 may be attached to the package substrate 204 according to a variety of suitable configurations including, a flip-chip configuration, as depicted, or other configurations such as wirebonding and the like. In the flip-chip configuration, active sides of the dies 210, 212 may be attached to a surface of the package substrate 204 using various structures such as solder bumps or pillars (not shown). The active side of the dies 210, 212 may have one or more transistor devices formed thereon. Each of the dies 210, 212 may represent a discrete chip. The dies 210, 212 may be, include, or be a part of a processor, memory, or application specific integrated circuit (ASIC) in some embodiments.

A bridge (e.g., bridge 206) may be disposed so as to electrically connect the dies 210, 212. In some embodiments, a bridge may be disposed between some dies on the package substrate 204 and not between other dies. In some embodiments, the bridge 206 may not be visible from a top view. As shown, the bridge 206 is embedded in the package substrate 204. In some embodiments, the dies 210, 212 may be electrically coupled with a bridge 206 that is configured to route electrical signals between the dies 210, 212. The bridge 206 may be a high density routing structure that provides a route for electrical signals. The bridge 206 may include a bridge substrate 214 composed of glass or a semiconductor material (e.g., high resistivity silicon (Si)) having electrical routing interconnect features formed thereon, described below in detail) to provide a chip-to-chip connection between the dies 210, 212. The bridge 206 may be composed of other suitable materials in other embodiments.

The bridge 206 may be embedded in a cavity of the package substrate 204 in some embodiments. The bridge 206 may comport with embodiments described in connection with a bridge described in other figures herein. For example, in some embodiments, the bridge 206 may include interconnect structures to serve as electrical routing features between the dies 210, 212 of the bridge 206. In some embodiments, a portion of the dies 210, 212 may overlay the embedded bridge 206, as can be seen.

In some embodiments, intervening materials or layers may be included in the IC package assembly 200. For example, the circuitry layers and elements such as layers 240 and 242 may be disposed as shown in FIG. 2. The circuitry layers (e.g., layers 240 and 242) may be connected through plated through hole (not shown) in core layer 244 comprising an organic material. An additional layer 246 comprising organic material (that may be different than the organic material of the core layer) may be included the IC package assembly 200. It should be understood that the layers 240, 242, 244, and 246 are shown for illustrative purposes only and are not limiting in any way to this description. Different configurations of the IC package assembly 200 may be provided that may utilize the interconnect structure described herein.

The interconnect structures 220, 222 may be configured to route electrical signals between the dies 210, 212 and the embedded bridge 206. In some embodiments, the interconnect structures 220 may be configured to route electrical signals such as, for example, input/output (I/O) signals and/or power or ground signals associated with the operation of the dies 210, 212. The forming and composition of the interconnect structures 220, 222 will be discussed in greater detail in reference to FIGS. 3-8. As shown, the interconnect structures 220, 222 may include vias 260, 262 respectively, formed through the package substrate 204 and extending into the surface of the bridge substrate 214 so as to electrically connect with conductive features 280 and 282 (respectively) disposed about (e.g., on or beneath) the surface of the bridge substrate 214. In some embodiments, the vias 260, 262 may be filled with a conductive material, such as copper, to provide for electrical contact with the conductive features 280, 282. The interconnect structures 220, 222 may be coupled to a surface of the package substrate 204 to further route the electrical signals to other electrical devices (e.g., motherboard or other chipset represented by the dies 210, 212).

The IC package assembly 200 may include other electrical routing features configured to route electrical signals between the dies 210, 212. The electrical routing features may be internal and/or external to the bridge 206. For example, in some embodiments, the bridge substrate 214 may include electrical routing features such as electrically conductive line 270 (e.g., corresponding to the lines 150, 152 in FIG. 1) configured to route electrical signals between the dies 210, 212 via interconnect structures 220, 222.

Although two dies 210, 212 and one bridge 206 is depicted in connection with FIG. 2, other embodiments may include more or fewer dies and bridges connected together in other possible configurations including three-dimensional configurations. For example, another die that is disposed on the package substrate 204 may be coupled to the dies 210, 212 using another bridge.

FIGS. 3-8 schematically illustrate cross-section side views of the example IC package assembly 100 of FIG. 1 along line AB (or IC package assembly 200 of FIG. 2) showing different stages of forming interconnect structures for die electric connection, in accordance with some embodiments. More specifically, FIGS. 3-8 illustrate the example IC package assembly subsequent to various fabrication operations adapted to form interconnect structures, in accordance with some embodiments. The dies 210, 212 are omitted from the view for the sake of clarity. In FIGS. 3-8, the IC package assembly 300 may include a package substrate 304 made of a dielectric (e.g., organic) material, similar to the package substrate 204 discussed above. Other layers of the package assembly 300 are shown for illustration purposes. For example, the circuitry layers such as layers 340 and 342 (similar to layers 240 and 242) may be disposed in the package assembly as shown in FIGS. 3-8. The circuitry layers may be connected through plated through hole (not shown) in core layer 344 (similar to layer 244) comprising an organic material. An additional layer 346 (similar to layer 246) comprising organic material may be included the package assembly 300. The package assembly may further include a bridge 306, embedded in the package substrate 304 similarly to bridge 206 discussed above.

The bridge 306 may include a bridge substrate 314, which may be composed of a high resistivity/low conductivity material such as, for example, glass or semiconductor material such as silicon (Si), as discussed above in reference to FIG. 2. One or more interconnect structures may be formed on and through the bridge substrate 314 as will be discussed below. For simplicity purposes, the numerals indicating the layers 304, 340, 342, 344, 346, and 314 are shown in FIG. 3 only, but may be applied to the package assemblies depicted in subsequent FIGS. 4 to 8.

Additional electrical routing features such as, for example, conductive lines and the like (not shown) may be formed in the bridge substrate 314 to route the electrical signals between dies (e.g., dies 210, 212 of FIG. 1) on the package substrate 304.

Figure 3:
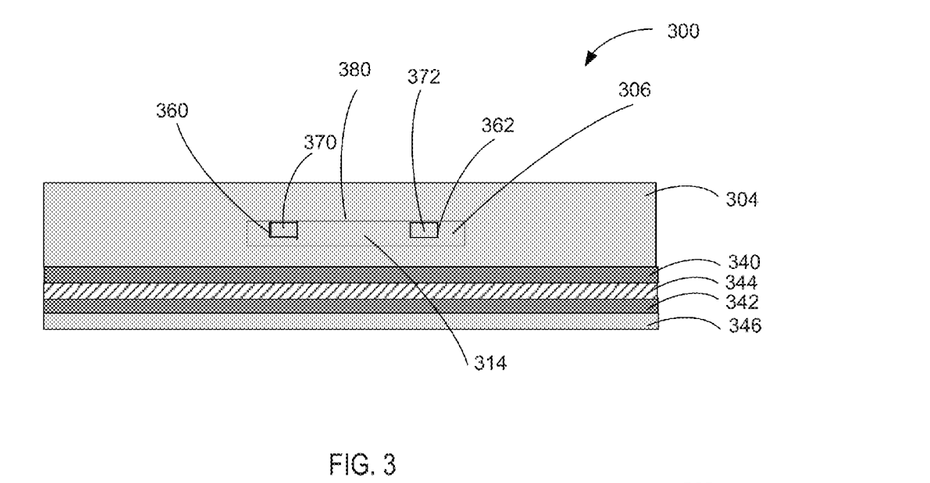
FIGS. 3-8 schematically illustrate cross-section side views of the example IC package assembly subsequent to various fabrication operations, in accordance with some embodiments.

Referring now to FIG. 3, the package assembly 300 is depicted subsequent to embedding the bridge 306 in the package substrate 304. In some embodiments, the bridge 306 may be placed in a cavity formed in the package substrate 304 to provide the embedded bridge 306 as depicted in the package assembly 300. For example, the embedded bridge may be disposed in the package substrate 304 using a dielectric lamination, such as, for example, Ajinomoto Build-up Film (ABF) lamination.

In some embodiments, the bridge 306 may include one or more vias 360, 362 or indents formed on a surface of the bridge substrate 314. Each of the vias 360 may include conductive features 370, 372 such as electrically conductive lines configured to provide connection between the conductive features, similar to electrically conductive line 270 in reference to FIG. 2. As shown, the conductive features 370, 372 may be disposed about a surface 380 of the bridge substrate 314, for example, substantially flat or planar with the surface 380 of the bridge substrate 314. In one example, the conductive features 370, 372 may be disposed on or just beneath the surface 380 of the bridge substrate 314.

Figure 4:
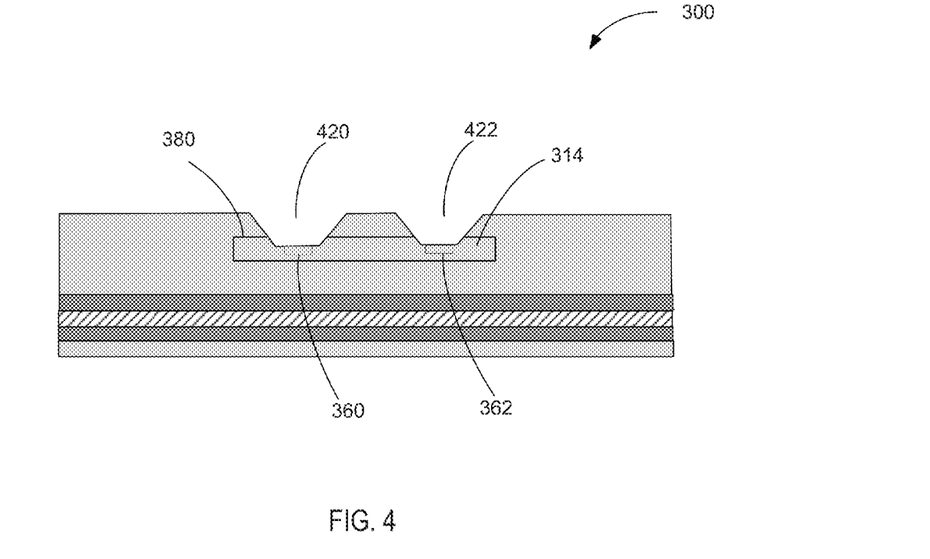

Referring to FIG. 4, the package assembly 300 is depicted subsequent to forming one or more openings for electrical routing features such as, for example, vias 420, 422 through the bridge substrate 314 and inside the surface of the bridge substrate 314. In some embodiments, one or more vias 420, 422 may be formed through the bridge substrate 314, as may be seen, to provide an electrical pathway through the bridge substrate 314. The vias 420, 422 may be drilled through the dielectric material of the package substrate 304. The vias 420, 422 making the interconnection to the embedded bridge 306 may be sized to capture the misalignment (if any) between the drilled vias to the bridge substrate surface vias 360 and 362 respectively.

To ensure reliability at the via-on-via interface, the vias 420, 422 that are drilled through the package substrate 304 may extend partially into the surface 380 of the bridge substrate 314, which in some embodiments may comprise a silicon layer. Accordingly, the vias 420, 422 drilled through the package substrate 304 may interface with the vias 360, 362 having respective conductive features 370, 372, within the silicon layer of the bridge substrate 314. Given a low coefficient of thermal expansion (CTE) and high Young's modulus of the silicon, the via interface formed as described herein may be more reliable than an interface formed substantially at the intersection of the silicon layer of the bridge 306 and silicon oxide layer of the package substrate 304.

Excimer laser or other laser sources featuring sufficient silicon absorption may be used to drill the vias 420, 422 through the dielectric substrate 304 so as to penetrate through, for example, a silicon-silicon oxide interface of the substrates 304 and 314. Desmear may be applied after laser drilling in order to clean the vias and roughen the dielectric surface of the vias 420, 422.

Figure 5:
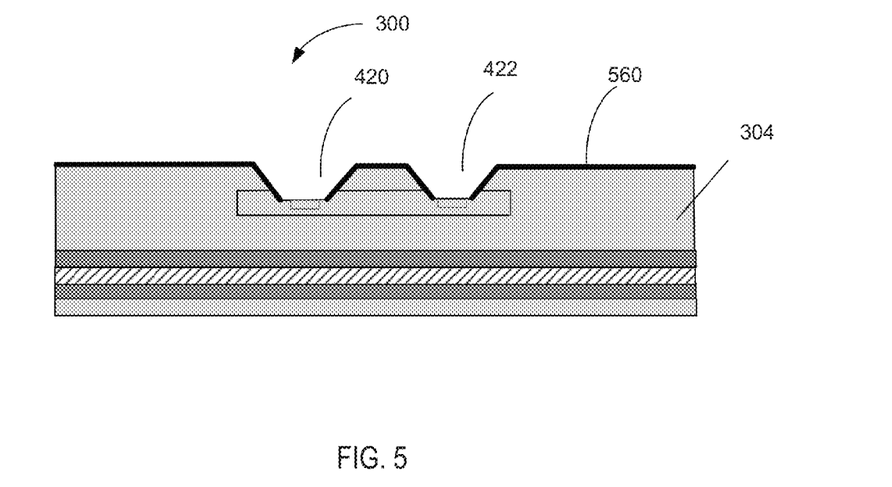

Referring to FIG. 5, the package assembly 300 is depicted after a conductive seed material 560 is deposited on the package substrate 304. For example, the conductive seed material 560 may be deposited by plating or sputtering the surface of the package substrate 304 and the vias 420, 422. In some embodiments, the plating may be electroless plating, in which a conductive seed material 560, such as copper seed layer is plated across the surfaces of the package substrate 304 and the vias 420, 422.

Figure 6:
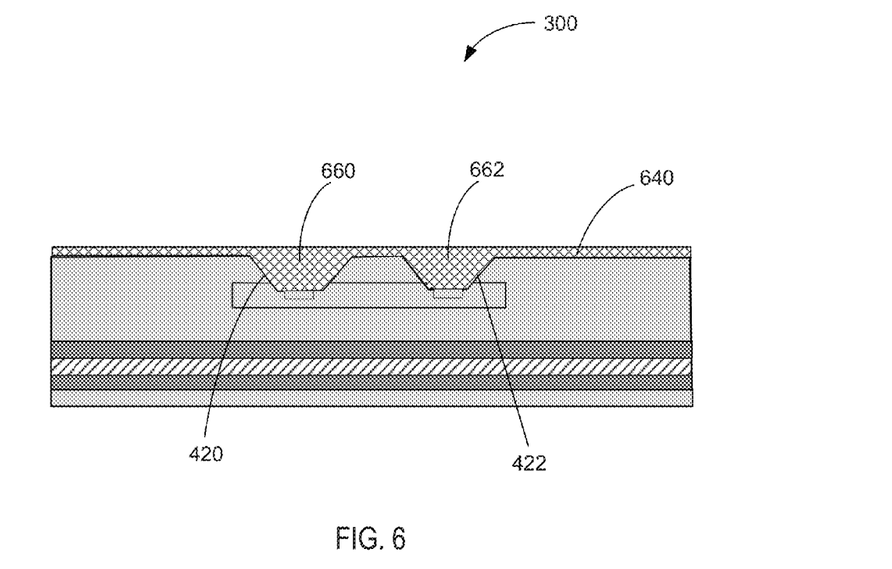

Referring to FIG. 6, the package assembly 300 is depicted subsequent to the application of electrolytic panel plating to the surface of the package substrate 304 and the vias 420, 422. As a result of electrolytic plating, a conductive material layer 640, for example, copper, may be plated across the surfaces of the package substrate 304 and inside the vias 420, 422. As a result, the vias 420, 422 are filled with portions 660, 662 of the conductive material layer 640, in electrical contact with the conductive features 370, 372 disposed within the surface of the bridge substrate 314 as described in reference to FIG. 3.

In general, there are different ways of filling the vias 420, 422 with a conductive material in order to form interconnect structures between the dies. The plating described in reference to FIGS. 5-6 is but one example of providing conductive material to the vias 420, 422 so as to form interconnect structures. Other suitable techniques to form vias 420, 422 filled with electrically conductive material may be used in other embodiments.

Figure 7:
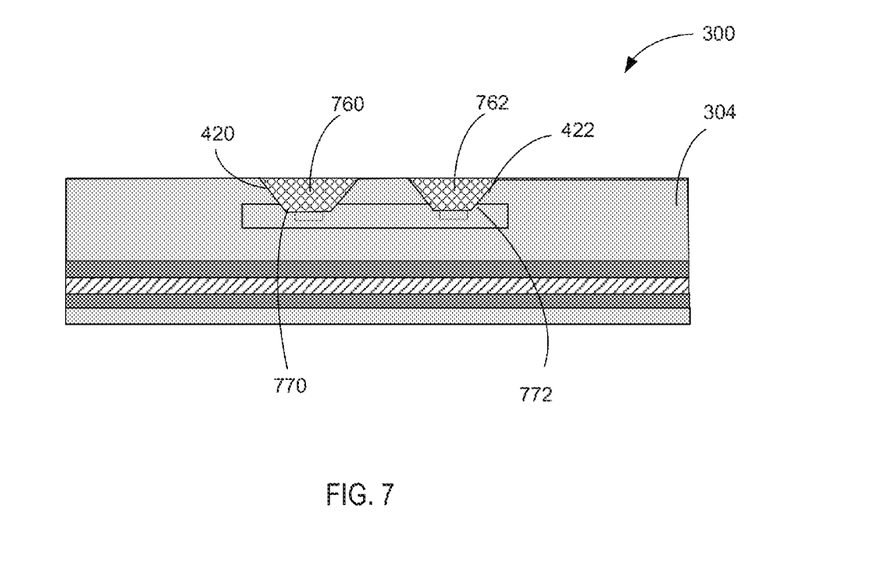
Figure 8:
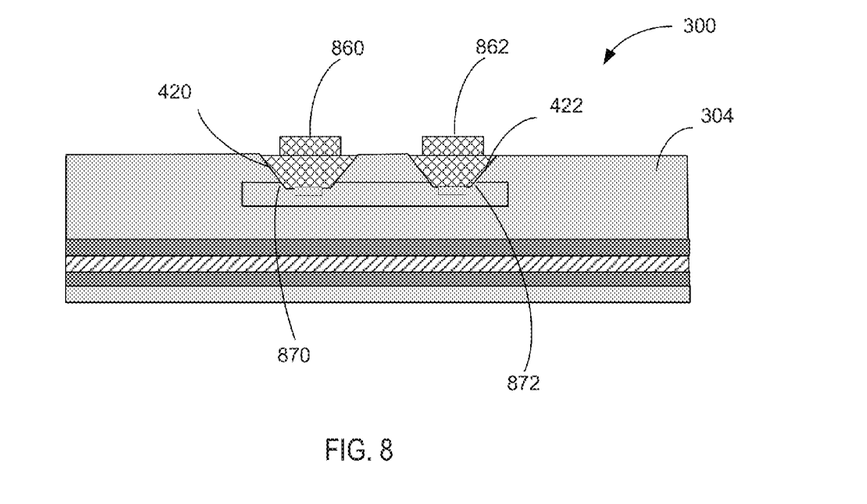

FIGS. 7 and 8 describe operations that may be applied to the package assembly 300 subsequent to the plating operations described in reference to FIGS. 5-6 or similar operations resulting in filling the vias 420, 422 with a conductive material. The operations described in reference to FIGS. 7 and 8 may be applied in the alternative (e.g., operation described in reference to FIG. 6 may be followed by the operation described in reference to FIG. 7 or the operation described in reference to FIG. 8).

Referring to FIG. 7 the package assembly 300 is depicted subsequent to a removal of the conductive material layer 640 from the surface of the package substrate 304 that was formed as a result of the plating described in reference to FIGS. 5 and 6. In some embodiments, chemical mechanical polishing (CMP) or copper etching may be applied in order to remove the layer of the conductive material from the surface of the package substrate 304 in order to expose the surfaces of the conductive material 760, 762 filling the via 420, 422.

Accordingly, as a result of the CMP or copper etching the conductive material 760, 762 filling the vias 420, 422 may be polished or etched back so as to be flush or planar with the surface of the package substrate 304. The vias 420, 422 filled with the conductive material 760, 762 and formed as described in reference to FIGS. 3-7 may comprise interconnect structures 770, 772 configured to route electrical signals between the dies 210, 212 described in reference to FIG. 2, when mounted on top of the package assembly 300 formed as described above.

Referring to FIG. 8 the package assembly 300 is depicted subsequent to subtractive etching applied to the conductive material layer 640, which may result in a removal of the conductive material layer 640 from the surface of the packages substrate 304 that was formed as a result of the plating described in reference to FIGS. 5 and 6. Furthermore, the conductive material (e.g., copper) fillings 660, 662 of the vias 420, 422 may be etched out so as to form pillars 860, 862 extending from the vias and protruding through the surface of the package substrate 304.

The vias 420, 422 filled with the conductive material 760, 762 and having pillars 860, 862 formed as described in reference to FIGS. 3-6 and 8 may comprise interconnect structures 870, 872 configured to route electrical signals between the dies 210, 212 described in reference to FIG. 2, when mounted on top of the assembly 300 formed as described above.

In some embodiments, additional lamination with photo resisting material on top of the conductive material may be applied in order to protect etched out surface of the vias 420, 422. After each of the operations described in reference to FIG. 7 or 8, the dies (e.g., dies 210, 212) may be mounted on top of the package assembly using any suitable surface mounting technique including, for example, soldering.

As a result of the operations described in reference to FIGS. 3-8, according to various embodiments, electrically conductive interconnect structures (e.g., one or more structures including vias 420, 422 filled with conductive material so as to have electrical contact with conductive features 370, 372 and optionally include conductive pillars 860, 862 may be configured to route I/O signals between the dies mounted overlaying the bridge 306 on top of the package substrate 304. The conductive features 370, 372 may be scaled to about 5 micrometers or less in diameter, and the vias 420, 422 may be sized large enough to interface the conductive features 270, 272 with a determined alignment value. Accordingly, the size of vias 360, 362 having conductive features 370, 372 may provide for substantial scalability, which may result in a superior via pitch scaling capability. As described above, the interconnect structures may be composed of any suitable material including metals such as copper.

Figure 9:
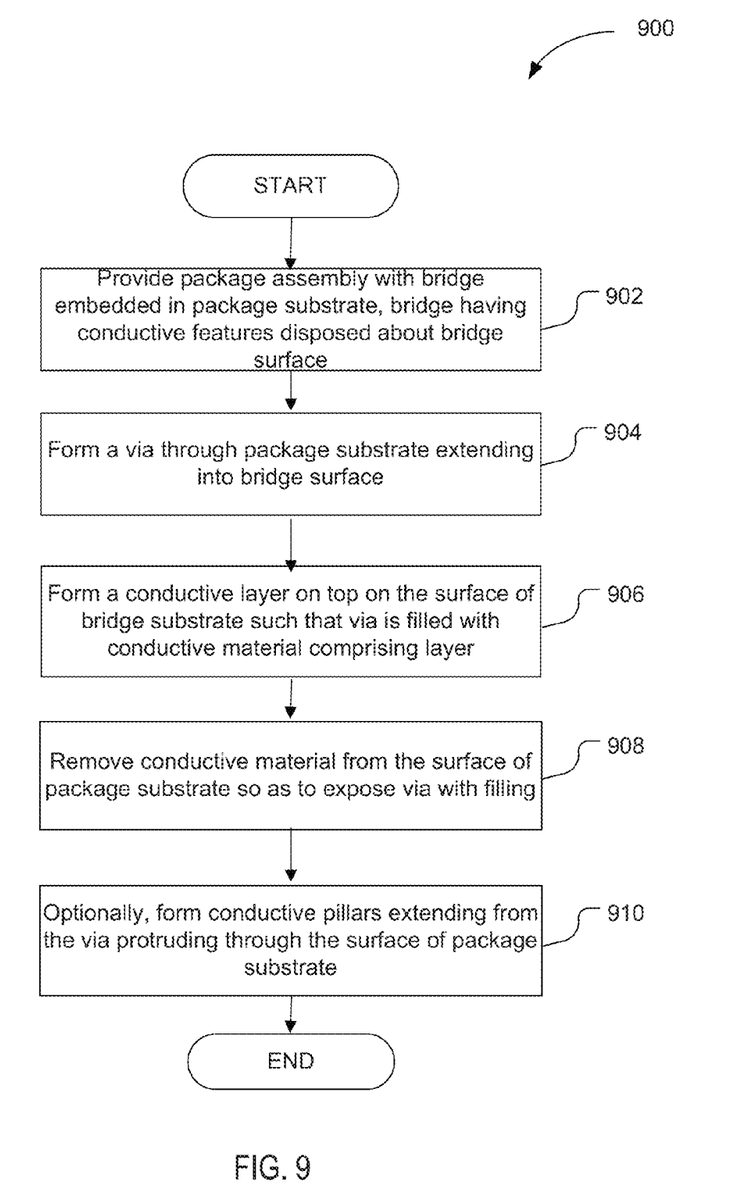
FIG. 9 schematically illustrates a flow diagram for a method of fabricating an IC package assembly, in accordance with some embodiments.

FIG. 9 schematically illustrates a flow diagram for a method 900 of fabricating an IC package assembly (e.g., the IC package assembly 200 of FIG. 2), in accordance with some embodiments. The method 900 may comport with actions described in connection with FIGS. 1-8 in some embodiments.

At 902, the method 900 may include providing a package assembly including a package substrate and a bridge substrate composed of glass, ceramic, or a semiconductor material and embedded in the package substrate. In some embodiments, the bridge may include one or more conductive features disposed about a surface of the bridge substrate, as described in reference to FIG. 3.

At 904, the method 900 may further include forming interconnect structures, such as vias through the package substrate and extending into the surface of the bridge substrate so as to reach the conductive features disposed in the bridge as described in reference to FIG. 4.

At 906, the method 900 may further include forming a conductive layer on a surface of the bridge substrate, such as by filling vias with conductive material by plating the material around the surface of the package substrate as described in reference to FIGS. 5 and 6.

At 908, the method 900 may further include removing conductive material from the surface of the package substrate so as to expose the via with filling and form interconnect structures as described in reference to FIG. 7.

At 910, the method 900 may further include optionally, alternatively or additionally to the operation performed at 908, forming the conductive pillars extending through the surface of the package substrate so as to form interconnect structures as described in reference to FIG. 8. In some embodiments, the method 900 may further include depositing a finishing film on the package substrate.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 10:
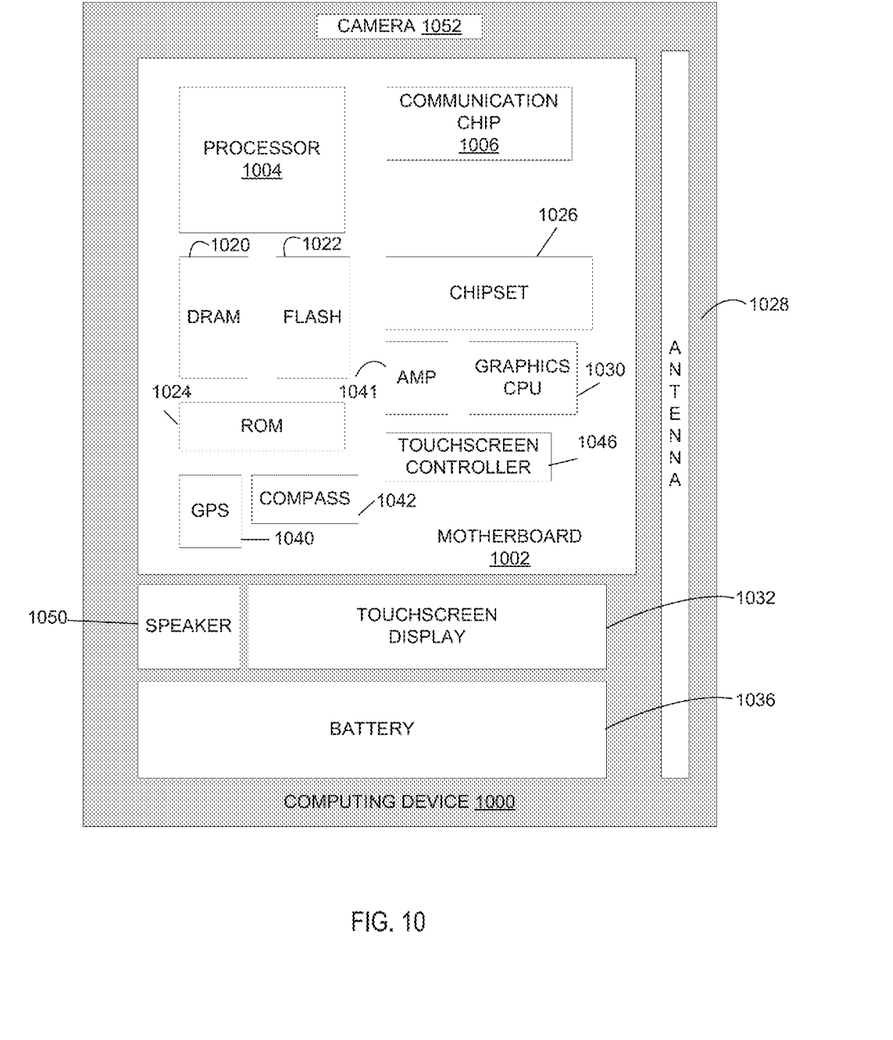
FIG. 10 schematically illustrates an example computing device including an IC package assembly, in accordance with some embodiments.

FIG. 10 schematically illustrates a computing device 1000 in accordance with some embodiments. The computing device 1000 may house a board such as motherboard 1002. The motherboard 1002 may include a number of components, including but not limited to a processor 1004 and at least one communication chip 1006. The processor 1004 may be physically and electrically coupled to the motherboard 1002. In some implementations, the at least one communication chip 1006 may also be physically and electrically coupled to the motherboard 1002. In further implementations, the communication chip 1006 may be part of the processor 1004.

Depending on its applications, computing device 1000 may include other components that may or may not be physically and electrically coupled to the motherboard 1002. These other components may include, but are not limited to, volatile memory (e.g., DRAM) 1020, non-volatile memory (e.g., ROM) 1024, flash memory 1022, a graphics processor 1030, a digital signal processor or a crypto processor (not shown), a chipset 1026, an antenna 1028, a display (e.g., touchscreen display) 1032, a touchscreen controller 1046, a battery 1036, a power amplifier 1041, a global positioning system (GPS) device 1040, a compass 1042, a speaker 1050, a camera 1052, a mass storage device (such as hard disk drive, compact disk (CD), or digital versatile disk (DVD)), an audio codec, a video codec, a Geiger counter, an accelerometer, a gyroscope, (not shown) and so forth.

The communication chip 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 may include a die (e.g., dies 102 of FIG. 1) in an IC package assembly (e.g., IC package assembly 100 of FIG. 1) as described herein. For example, a package substrate (e.g., package a substrate 204 of FIG. 2) having the die mounted thereon may be coupled with a circuit board such as, for example, motherboard 1002, using package-level interconnects such as, for example, ball-grid array (BGA) or land-grid array (LGA) structures. The term "processor" may refer to any device or portion of a device that processes electronic data from registers and/or memory to transform that electronic data into other electronic data that may be stored in registers and/or memory.

The communication chip 1006 may also include a die (e.g., dies 210, 212 of FIG. 2) in an IC package assembly (e.g., IC package assembly 200 of FIG. 2) as described herein. In further implementations, another component (e.g., memory device or other integrated circuit device) housed within the computing device 1000 may contain a die (e.g., dies 210, 212 of FIG. 2) in an IC package assembly as described herein, such as, for example, IC package assembly 200 of FIG. 2 with interconnect structures formed as described in reference to FIGS. 3-9. Such dies may be configured to send or receive signals through a bridge as described herein.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

According to various embodiments, the present disclosure describes a number of examples. Example 1 is a package assembly comprising a package substrate; a bridge embedded in the package substrate, the bridge including a bridge substrate; and an interconnect structure including a via extending through the package substrate to interface with a conductive feature disposed on or beneath the surface of the bridge substrate. The interconnect structure may be configured to route electrical signals between the conductive feature and a die mounted on the package substrate.

Example 2 may include the subject matter of Example 1, and further specifies that the via is filled with a conductive material and the conductive feature comprises the conductive material, the conductive material including copper (Cu).

Example 3 may include the subject matter of Example 2, and further specifies that the package assembly further includes a conductive pillar formed on top of the via and protruding through a surface of the package substrate, the conductive pillar configured to route the electrical signals between the conductive feature and the die, wherein the die is electrically coupled with the conductive pillar.

Example 4 may include the subject matter of Example 1, and further specifies the electrical signals are input/output (I/O) signals.

Example 5 may include the subject matter of Example 1, and further specifies the bridge substrate comprises a glass, ceramic, or semiconductor material, the semiconductor material including silicon (Si), and wherein the package substrate comprises a dielectric material including silicon oxide (SiO2).

Example 6 may include the subject matter of Example 1, and further specifies the die is a logical die or a memory die.

Example 7 may include the subject matter of Example 1, and further specifies that a diameter of the via is greater than a diameter of the conductive feature.

Example 8 may include the subject matter of Example 7, and further specifies the conductive feature includes an electrically conductive line.

Example 9 may include the subject matter of Example 8, and further specifies the bridge includes another interconnect structure coupled with the interconnect structure via the electrically conductive line, the conductive line being disposed within the bridge substrate between the interconnect structure and the another interconnect structure, to provide electrical connection between the die and another die mounted on the surface of the package substrate, the another die being electrically coupled with the another interconnect structure.

Example 10 may include the subject matter of Example 1, and further specifies the bridge substrate is embedded in the package substrate using Ajinomoto Build-up Film (ABF) lamination.

Example 11 is an apparatus comprising a bridge substrate; and at least one interconnect structure including: a conductive feature disposed beneath a surface of the bridge substrate; and a conductive element extending into the surface of the bridge substrate, the conductive element being configured to interface with the conductive feature to route electrical signals between the conductive feature and a die.

Example 12 may include the subject matter of Example 11, and further specifies that the conductive element includes a conductive pillar extending from an end of the conductive element that is opposite another end interfacing with the conductive feature, the conductive pillar configured to electrically couple with the die.

Example 13 may include the subject matter of Example 11, and further specifies that the electrical signals are input/output (I/O) signals.

Example 14 may include the subject matter of Example 11, and further specifies that the bridge substrate comprises a glass, ceramic, or semiconductor material.

Example 15 may include the subject matter of Example 11, and further specifies that the conductive element and the conductive feature comprise a conductive material, the conductive material including copper (Cu), wherein the conductive feature includes an electrically conductive line.

Example 16 may include the subject matter of Example 11, and further specifies that the apparatus further comprises the die, wherein the conductive element comprises a via formed through a dielectric substrate disposed on top of the bridge substrate, and the die is disposed on the bridge substrate and electrically coupled with the conductive element.

Example 17 may include the subject matter of Example 16, and further specifies that the conductive feature is disposed beneath the surface of the bridge substrate.

Example 18 is a method comprising forming a via through a package substrate to expose a conductive feature disposed on or beneath a surface of a bridge that is embedded in the package substrate, the bridge including a bridge substrate comprising a glass, ceramic, or a semiconductor material; forming an electrically conductive layer on the package substrate such that the via is filled with a conductive material comprising the electrically conductive layer, the filled via providing electrical connection with the conductive feature; and removing a portion of the electrically conductive layer from a top surface of the package substrate.

Example 19 may include the subject matter of Example 18, and further specifies that the method further comprises forming, from the conductive material in the via, a conductive pillar extending from the filled via and protruding beyond the top surface of the package substrate.

Example 20 may include the subject matter of Example 19, and further specifies that forming the conductive pillar includes subtractive etching of the conductive material of the via.

Example 21 may include the subject matter of Example 18, and further specifies that forming the via further includes desmearing a surface of the via to clean the via.

Example 22 may include the subject matter of Example 18, and further specifies that the method includes, prior to forming the electrically conductive layer, depositing material having the same chemistry as the conductive material by electroless plating or sputtering to a surface of the package substrate.

Example 23 may include the subject matter of Example 18, and further specifies that forming the electrically conductive layer includes depositing the conductive material by electrolytic plating to a surface of the package substrate, wherein forming a via through a package substrate includes drilling the via with an excimer laser.

Example 24 may include the subject matter of Example 18, and further specifies that the conductive material comprises copper (Cu), the semiconductor material comprises silicon (Si), and the package substrate comprises organic dielectric material and conductive material.

Example 25 may include the subject matter of Example 18, and further specifies that the method includes, prior to forming a via, embedding the bridge into the package substrate using Ajinomoto Build-up Film (ABF) lamination.

Example 26 is an apparatus comprising means for forming a via through a package substrate and extending into a surface of a bridge embedded in the package substrate to expose a conductive feature disposed on or beneath the surface of the bridge, the bridge including a bridge substrate comprising a glass, ceramic, or a semiconductor material; means for forming an electrically conductive layer on the package substrate such that the via is filled with a conductive material comprising the electrically conductive layer, the filled via providing electrical connection with the conductive feature; and means for removing a portion of the electrically conductive layer from a top surface of the package substrate.

Example 27 may include the subject matter of Example 18, and further specifies that the apparatus further comprises means for forming, from the conductive material in the via, a conductive pillar extending from the filled via and protruding beyond the top surface of the package substrate.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A package assembly comprising:
a package substrate having a die mounted on a surface of the package substrate;
a bridge embedded inside the package substrate, the bridge including a bridge substrate, wherein the bridge substrate includes a first surface and a second surface opposite the first surface, wherein the first surface is disposed closer to the surface of the package substrate than the second surface, and wherein a distance between the first and second surfaces defines a substrate thickness; and
an interconnect structure including a substantially conically shaped via extending through the first surface into the bridge substrate at a depth that is less than half of the substrate thickness, to interface with a conductive feature disposed on or beneath the first surface of the bridge substrate, wherein the via is filled with a conductive material to form a conductive pillar on top of the via, wherein the conductive pillar protrudes through the surface of the package substrate, and wherein a diameter of the conductive pillar is smaller than a diameter of a base of the conically shaped via formed on the surface of the package substrate, wherein the interconnect structure is to route electrical signals between the conductive feature and the die mounted on the surface of the package substrate.

2. The package assembly of claim 1, wherein the conductive feature comprises the conductive material, the conductive material including copper (Cu).

3. The package assembly of claim 2, wherein the conductive pillar is to route the electrical signals between the conductive feature and the die, wherein the die is electrically coupled with the conductive pillar.

4. The package assembly of claim 1, wherein the electrical signals are input/output (I/O) signals.

5. The package assembly of claim 1, wherein the bridge substrate comprises a glass, ceramic, or semiconductor material, the semiconductor material including silicon (Si), and wherein the package substrate comprises a dielectric material including silicon oxide ($SiO_2$).

6. The package assembly of claim 1, wherein the die is a logical die or a memory die.

7. The package assembly of claim 1, wherein a diameter of the base of the conically shaped via formed on the surface of the package substrate is greater than a diameter of the conductive feature.

8. The package assembly of claim 7, wherein the conductive feature includes an electrically conductive line.

9. The package assembly of claim 8, wherein the bridge includes another interconnect structure coupled with the interconnect structure via the electrically conductive line, the conductive line being disposed within the bridge substrate between the interconnect structure and the another interconnect structure, to provide electrical connection between the die and another die mounted on the surface of the package substrate, the another die being electrically coupled with the another interconnect structure.

10. The package assembly of claim 1, wherein the bridge substrate is embedded in the package substrate using Ajinomoto Build-up Film (ABF) lamination.

11. An apparatus comprising:
a bridge substrate, wherein the bridge substrate includes a first surface and a second surface opposite the first surface, wherein the first surface is disposed closer to the surface of the package substrate than the second surface, and wherein a distance between the first and second surfaces defines a substrate thickness; and
at least one interconnect structure including a substantially conically shaped via extending through the first surface into the bridge substrate at a depth that is less than half of the substrate thickness, to interface with a conductive feature disposed on or beneath the first surface of the bridge substrate, wherein the via is filled with a conductive material to form a conductive pillar on top of the via, wherein the conductive pillar protrudes through the surface of the package substrate, and wherein a diameter of the conductive pillar is smaller than a diameter of a base of the conically shaped via formed on the surface of the package substrate,
wherein the interconnect structure is to route electrical signals between the conductive feature and the die mounted on the surface of the package substrate.

12. The apparatus of claim 11, wherein the conductive pillar extends from an end of a conductive element that is opposite another end interfacing with the conductive feature, the conductive pillar configured to electrically couple with the die.

13. The apparatus of claim 11, wherein the electrical signals are input/output (I/O) signals.

14. The apparatus of claim 11, wherein the bridge substrate comprises a glass, ceramic, or semiconductor material.

15. The apparatus of claim 11, wherein the conductive element and the conductive feature comprise a conductive material, the conductive material including copper (Cu), wherein the conductive feature includes an electrically conductive line.

16. The apparatus of claim 11, further comprising the die, wherein the conductive element comprises a via formed through a dielectric substrate disposed on top of the bridge substrate, and the die is disposed on the bridge substrate and electrically coupled with the conductive element.

17. The apparatus of claim 16, wherein the conductive feature is disposed beneath the surface of the bridge substrate.

18. A method, comprising:
forming a substantially conically shaped via through a package substrate to expose a conductive feature disposed on or beneath a surface of a bridge that is embedded in the package substrate, the bridge including a bridge substrate comprising a glass, ceramic, or a semiconductor material, and further including a first surface and a second surface opposite the first surface, wherein the first surface is disposed closer to the surface of the package substrate than the second surface, and wherein a distance between the first and second surfaces defines a substrate thickness, the forming including extending the via through the first surface into the bridge substrate at a depth that is less than half of the substrate thickness, to interface with a conductive feature disposed on or beneath the first surface of the bridge substrate, wherein the via is filled with a conductive material to form a conductive pillar on top of the via, wherein the conductive pillar protrudes through the surface of the package substrate, and wherein a diameter of the conductive pillar is smaller than a diameter of a base of the conically shaped via formed on the surface of the package substrate;
forming an electrically conductive layer on the package substrate such that the via is filled with a conductive material comprising the electrically conductive layer, the filled via providing electrical connection with the conductive feature; and
removing a portion of the electrically conductive layer from a top surface of the package substrate.

19. The method of claim 18, further comprising:
forming, from the conductive material in the via, the conductive pillar extending from the filled via and protruding beyond the top surface of the package substrate.

20. The method of claim 19, wherein forming the conductive pillar includes subtractive etching of the conductive material of the via.

21. The method of claim 18, wherein forming the via further includes desmearing a surface of the via to clean the via.

22. The method of claim 18, further comprising:
prior to forming the electrically conductive layer, depositing material having the same chemistry as the conductive material by electroless plating or sputtering to a surface of the package substrate.

23. The method of claim 18, wherein forming the electrically conductive layer includes depositing the conductive material by electrolytic plating to a surface of the package substrate, wherein forming a substantially conically shaped via through a package substrate includes drilling the via with an excimer laser.

24. The method of claim 18, wherein the conductive material comprises copper (Cu), the semiconductor material comprises silicon (Si), and the package substrate comprises organic dielectric material and conductive material.

25. The method of claim 18, further comprising:
  prior to forming a substantially conically shaped via, embedding the bridge into the package substrate using Ajinomoto Build-up Film (ABF) lamination.

* * * * *